(12) United States Patent
Habenicht et al.

(10) Patent No.: US 11,508,844 B2
(45) Date of Patent: Nov. 22, 2022

(54) SEMICONDUCTOR DEVICE

(71) Applicant: Nexperia B.V., Eindhoven (NL)

(72) Inventors: Soenke Habenicht, Hamburg (DE);
Steffen Holland, Hamburg (DE)

(73) Assignee: Nexperia B.V., Nijmegen (NL)

( * ) Notice: Subject to any disclaimer, the term of this patent is extended or adjusted under 35 U.S.C. 154(b) by 6 days.

(21) Appl. No.: 15/253,563

(22) Filed: Aug. 31, 2016

(65) Prior Publication Data
US 2017/0092761 A1 Mar. 30, 2017

(30) Foreign Application Priority Data
Sep. 29, 2015 (EP) ..................................... 15187379

(51) Int. Cl.
*H01L 29/10* (2006.01)
*H01L 29/417* (2006.01)
(Continued)

(52) U.S. Cl.
CPC ...... *H01L 29/7827* (2013.01); *H01L 29/0696* (2013.01); *H01L 29/0804* (2013.01);
(Continued)

(58) Field of Classification Search
CPC ............. H01L 29/0804; H01L 29/0808; H01L 29/0873; H01L 29/0882; H01L 29/1004; H01L 29/1008; H01L 29/41708; H01L 29/41741; H01L 29/41758; H01L 29/66666; H01L 29/735; H01L 29/7393; H01L 29/7802; H01L 29/7809;
(Continued)

(56) References Cited

U.S. PATENT DOCUMENTS 4,521,795 A * 6/1985 Coe ...................... H01L 29/0696
257/341
5,430,316 A * 7/1995 Contiero ............... H01L 21/765
257/335
(Continued)

FOREIGN PATENT DOCUMENTS

DE 19925880 A1 12/2000
EP 2325890 A1 5/2011
(Continued)

OTHER PUBLICATIONS

Sun et al., "Modeling of the On-Resistance of LDMOS, VDMOS, and VMOS Power Transistors," IEEE Transactions on Electron Devices, vol. ED-27, No. 2, Feb. 1980, p. 356-367. (Year: 1980).*
(Continued)

*Primary Examiner* — Benjamin Tzu-Hung Liu
(74) *Attorney, Agent, or Firm* — Ruggiero, McAllister & McMahon LLC

(57) ABSTRACT

A semiconductor device (300) comprising: a doped semiconductor substrate (302); an epitaxial layer (304), disposed on top of the substrate, the epitaxial layer having a lower concentration of dopant than the substrate; a switching region disposed on top of the epitaxial layer; and a contact diffusion (350) disposed on top of the epitaxial layer, the contact diffusion having a higher concentration of dopant than the epitaxial layer; wherein the epitaxial layer forms a barrier between the contact diffusion and the substrate.

14 Claims, 7 Drawing Sheets

(51) Int. Cl.
*H01L 29/66* (2006.01)
*H01L 29/735* (2006.01)
*H01L 29/78* (2006.01)
*H01L 29/08* (2006.01)
*H01L 29/06* (2006.01)
*H01L 29/739* (2006.01)

(52) U.S. Cl.
CPC ...... *H01L 29/0808* (2013.01); *H01L 29/0873* (2013.01); *H01L 29/0882* (2013.01); *H01L 29/1004* (2013.01); *H01L 29/1008* (2013.01); *H01L 29/41708* (2013.01); *H01L 29/41741* (2013.01); *H01L 29/41758* (2013.01); *H01L 29/66666* (2013.01); *H01L 29/66712* (2013.01); *H01L 29/735* (2013.01); *H01L 29/7393* (2013.01); *H01L 29/7809* (2013.01); *H01L 29/7816* (2013.01)

(58) Field of Classification Search
CPC ............. H01L 29/7827; H01L 29/7816; H01L 29/66712; H01L 29/0696; H01L 29/0684; H01L 29/42304; H01L 29/42356; H01L 29/66272; H01L 29/7322
See application file for complete search history.

(56) References Cited

U.S. PATENT DOCUMENTS

| | | | |
|---|---|---|---|
| 5,528,058 A * | 6/1996 | Pike, Jr. ................ | H01L 21/033 257/142 |
| 8,384,154 B2 | 2/2013 | Quoirin et al. | |
| 8,564,057 B1 | 10/2013 | Darwish et al. | |
| 9,431,480 B1 * | 8/2016 | Zhang ................... | H01L 29/063 |
| 9,608,105 B2 * | 3/2017 | Tamura ............... | H01L 29/7816 |
| 2003/0235942 A1 | 12/2003 | Nakamura et al. | |
| 2004/0000676 A1 * | 1/2004 | Fujioka ........... | H01L 21/823425 257/198 |
| 2004/0061131 A1 | 4/2004 | Winslow | |
| 2004/0079991 A1 * | 4/2004 | Lin ..................... | H01L 29/0615 257/E29.328 |
| 2005/0040431 A1 | 2/2005 | Iwabuchi et al. | |
| 2007/0205432 A1 | 9/2007 | Tsukao | |
| 2008/0042221 A1 * | 2/2008 | Tsau .................... | H01L 29/7835 257/E29.136 |
| 2009/0283827 A1 * | 11/2009 | Pendharkar ......... | H01L 29/0847 257/343 |
| 2010/0155836 A1 * | 6/2010 | Hebert ............ | H01L 21/823487 257/334 |
| 2011/0079849 A1 * | 4/2011 | Yan ..................... | H01L 29/4238 257/E29.256 |
| 2011/0156810 A1 | 6/2011 | Girdhar et al. | |
| 2012/0273878 A1 * | 11/2012 | Mallikarjunaswamy ................... | H01L 29/4175 257/335 |
| 2013/0221438 A1 | 8/2013 | Lee et al. | |
| 2013/0264640 A1 * | 10/2013 | Salman ............. | H01L 29/66659 257/343 |
| 2014/0361366 A1 * | 12/2014 | Cai ..................... | H01L 29/0653 257/343 |
| 2015/0060948 A1 | 3/2015 | Kawai et al. | |
| 2015/0180428 A1 | 6/2015 | Pham et al. | |
| 2015/0187933 A1 * | 7/2015 | Lin ..................... | H01L 29/0882 257/339 |

FOREIGN PATENT DOCUMENTS

| | | |
|---|---|---|
| WO | 2005052997 A2 | 6/2005 |
| WO | 2006098868 A2 | 9/2006 |

OTHER PUBLICATIONS

Sun et al., "Modeling of the On-Resistance of LDMOS, VDMOS, and VMOS Power Transistors," IEEE Transactions on Electron Devices, vol. ED-27, No. 2, Feb. 1980, p. 356-367. (Year: 1980) (Year: 1980).*

Sun et al., "Modeling of the On-Resistance of LDMOS, VDMOS, and VMOS Power Transistors," IEEE Transactions on Electron Devices, vol. ED-27, No. 2, Feb. 1980, p. 356-367. (Year: 1980) (Year: 1980) (Year: 1980).*

Sun et al., "Modeling of the On-Resistance of LDMOS, VDMOS, and VMOS Power Transistors," IEEE Transactions on Electron Devices, vol. ED-27, No. 2, Feb. 1980, p. 356-367. (Year: 1980) (Year: 1980) (Year: 1980).*

Extended European Search Report for EP Patent Appln. No. 15187379.1 (dated Jun. 10, 2016).

* cited by examiner

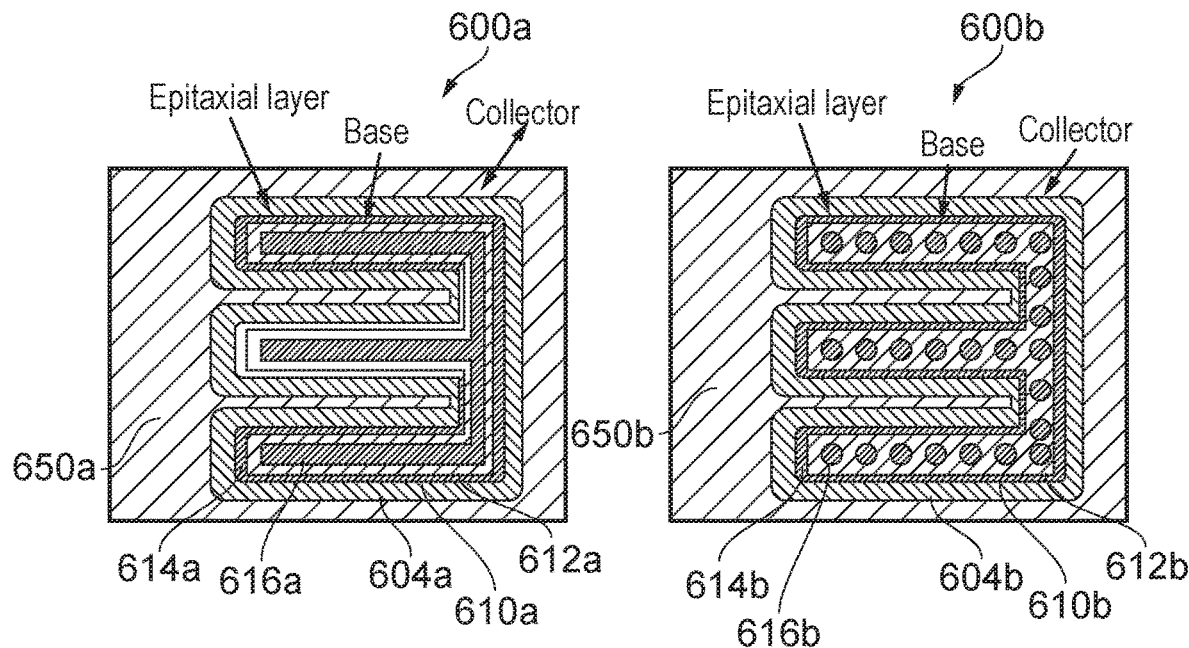
FIG. 6a
FIG. 6b
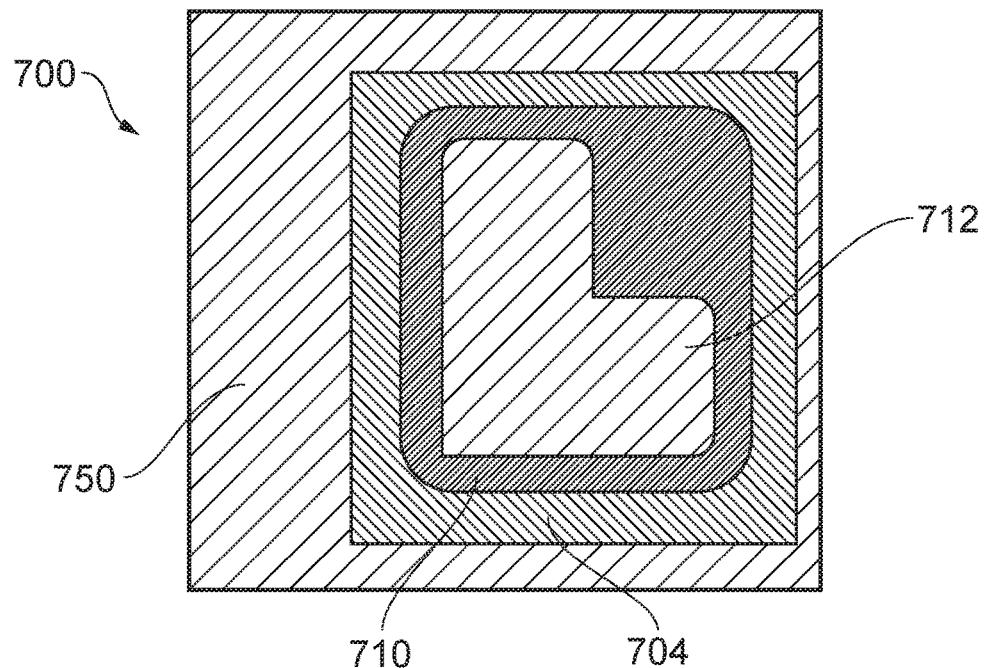
FIG. 7

SEMICONDUCTOR DEVICE

CROSS-REFERENCE TO RELATED APPLICATIONS

This application claims the priority under 35 U.S.C. § 119 of European Patent application no. 15187379.1, filed on Sep. 29, 2015, the contents of which are incorporated by reference herein.

The present disclosure relates to semiconductor devices and methods of fabricating the same. In particular, examples in this disclosure are relevant to transistors especially when fabricated as chip-scale package devices.

According to a first aspect of the present disclosure there is provided a semiconductor device comprising: a doped semiconductor substrate; an epitaxial layer, disposed on top of the substrate, the epitaxial layer having a lower concentration of dopant than the substrate; a switching region disposed on top of the epitaxial layer; and a contact diffusion disposed on top of the epitaxial layer, the contact diffusion having a higher concentration of dopant than the epitaxial layer; wherein the epitaxial layer forms a barrier between the contact diffusion and the substrate.

The contact diffusion may advantageously provide for an electrical coupling between the back-side of the semiconductor device (which comprises the substrate) and the front-side of the semiconductor device (disposed on an opposing face to the back-side of the semiconductor device. The contact diffusion may thereby enable a terminal to be connected to the front-side of the device that is connected to the back-side of the device via the epitaxial layer. Having the contact diffusion terminal on the same, front-side, of the semiconductor device as terminals disposed on the switching region of the semiconductor device may advantageously enable the semiconductor device to be configured as a highly compact chip-scale package device, without having any need to provide for a terminal directly physical coupled to the back-side of the semiconductor device.

In one or more embodiments the contact diffusion may extend around the switching region in a plane parallel to a surface of the substrate.

In one or more embodiments the semiconductor device may further comprise a contact terminal, wherein the contact diffusion may extend from the contact terminal towards the substrate and may be spaced apart from the substrate by the epitaxial layer.

In one or more embodiments the barrier between the contact diffusion and the substrate, provided by the epitaxial layer, may be at least 2 μm thick or at least 3 μm thick.

In one or more embodiments the barrier between the contact diffusion and the substrate, provided by the epitaxial layer, may be at least 20% of a full thickness of the epitaxial layer.

In one or more embodiments the switching region may comprise a plurality of limbs and the contact diffusion may comprise a plurality of limbs interdigitated between the plurality of limbs of the switching region.

In one or more embodiments a metallic contact diffusion terminal may be disposed on top of the contact diffusion and may be interdigitated between the limbs of the switching region.

In one or more embodiments the switching region may comprise: a base diffusion in contact with the epitaxial layer; and an emitter diffusion disposed on top of the base diffusion, the base diffusion configured to form a barrier between the emitter diffusion and the epitaxial layer.

In one or more embodiments the semiconductor device may comprise a bipolar junction transistor.

In one or more embodiments the emitter diffusion may comprise at least one loop portion, disposed on top of the base diffusion, that extends around an inner portion of the base diffusion.

In one or more embodiments each limb of the switching region may comprise an emitter diffusion limb disposed on top of a base diffusion limb.

In one or more embodiments a metallic emitter contact may be electrically connected to the emitter diffusion along at least a portion of a length of at least one limb of the emitter diffusion In one or more embodiments a metallic base contact may be electrically connected to the base diffusion along at least a portion of a length of at least one limb of the base diffusion.

In one or more embodiments the switching region may comprise: a body diffusion formed on top of the epitaxial layer; a source diffusion formed on top of the body diffusion; and a gate disposed on top of the switching region between the source diffusion and the body diffusion; wherein the substrate may comprise a drain for the semiconductor device.

In one or more embodiments the semiconductor device may comprise a Metal Oxide Semiconductor Field Effect Transistor and the contact diffusion may be configured to be electrically coupled to a drain terminal of the Metal Oxide Semiconductor Field Effect Transistor.

In one or more embodiments the semiconductor device may comprise a planar MOSFET.

In one or more embodiments the semiconductor device may comprise a vertical trench MOSFET.

In one or more embodiments the semiconductor device may comprise: a gate; a source diffusion configured to form a loop around the gate; and a body diffusion configured to form a loop around the source diffusion and the gate.

In one or more embodiments the semiconductor device may comprise: a plurality of gate portions; a source diffusion configured to form a plurality of loops around the plurality of gate portions; and a body diffusion configured to form a plurality of loops around the source diffusion and the plurality of gate portions.

In one or more embodiments a chip-scale package device may comprise the semiconductor device.

According to a further aspect of the present disclosure there is provided a method of providing a semiconductor device, the method comprising: providing a doped semiconductor substrate; disposing an epitaxial layer on top of the substrate, the epitaxial layer having a lower concentration of dopant than the substrate; disposing a switching region on top of the epitaxial layer; and disposing a contact diffusion on top of the epitaxial layer, the contact diffusion having a higher concentration of dopant than the epitaxial layer; wherein the epitaxial layer forms a barrier between the contact diffusion and the substrate.

In one or more embodiments the switching region and the contact diffusion may be provided as part of a single process step.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The Figures and Detailed Description that follow also exemplify various example embodiments. Various example embodiments may be more completely understood in consideration of the following Detailed Description in connection with the accompanying Drawings.

One or more embodiments will now be described by way of example only with reference to the accompanying drawings in which:

FIG. 6a shows a plan view of an example embodiment of a bipolar junction transistor with an emitter diffusion in a single loop configuration;

FIG. 6b shows a plan view of an example embodiment of a bipolar junction transistor with an emitter diffusion in a multiple loop configuration;

FIG. 7 shows a plan view of an example embodiment of a bipolar junction transistor with a collector diffusion surrounding a base diffusion;

Figure 1:
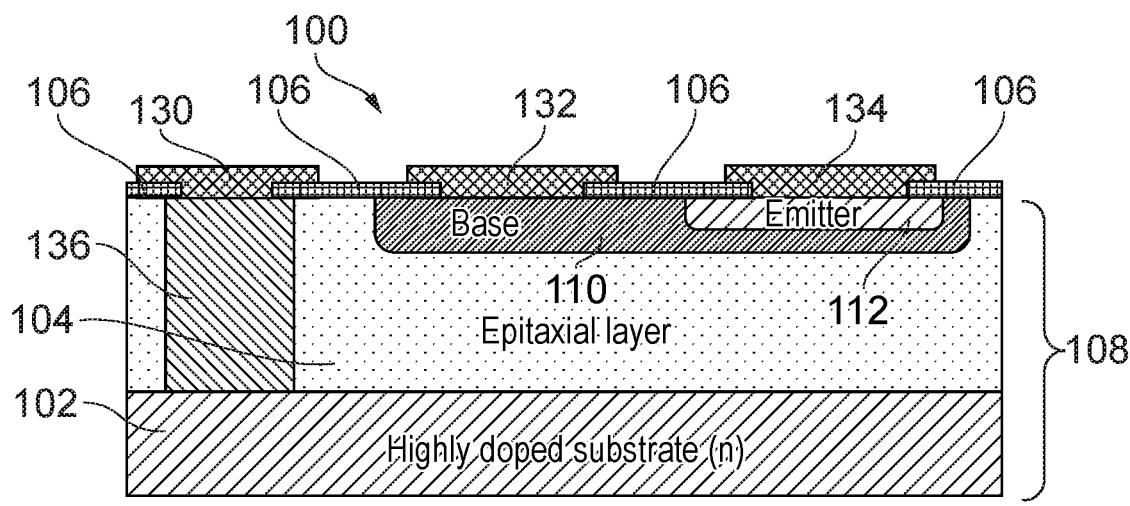
FIG. 1 shows a cross-section view of a bipolar junction transistor.

The instructions and/or flowchart steps in the above Figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

The present disclosure is relevant to the construction of semiconductor devices, either as discrete devices or as part of integrated circuits which may be fabricated on a semiconductor chip. This disclosure may be especially relevant to bare die semiconductor devices and to chip-scale package (CSP) semiconductor devices.

Chip-scale package devices have become progressively more prominent because of their superior properties in space limited applications such as portable electronics, wearable electronic devices or handheld devices. One of the technical challenges of CSP device fabrication is the interconnection technology of the input/output (IOs) between the printed circuit board and outer world. For Bipolar Junction Transistors (BJTs) or Metal Oxide Semiconductor Field Effect Transistors (MOSFETs) in particular, the collector/drain front contact is of special interest. In some architectures, particularly vertical architectures, the collector/drain contact is located at the bottom of the device via a highly doped semiconductor substrate. For conventional leaded devices Sn-soldering on Sn-plated leads is the most prominent interconnection technology. For CSP devices it can be advantageous to have a solderable top metal on the solder pads, which is capable of being interconnected to a printed circuit board by a conventional soldering technique, such as Sn-soldering.

The fabrication process for some devices uses a dedicated collector/drain contact process step either by deep diffusion, contact etching to the substrate, or trench etching technologies. These techniques may enable optimization of the contact resistance of the device. All of these technologies can be difficult to integrate in state-of-the-art cost-effective semiconductor process flows, especially when an active wafer back side is involved. This may cause technical problems for fabrication of vertical discrete semiconductor devices. Moreover, the costs of additional process steps may be difficult to compensate for in state-of-the-art bipolar junction transistor and MOSFET production flows.

One or more examples described in this disclosure provide a system architecture set suitable for bipolar junction transistors or MOSFET semiconductor devices with front contact architecture with one or more of the following advantageous properties: solderability by conventional Sn-based soldering methods; integration of emitter/source and collector/drain active area processing within one process step; sufficient collector/drain front contact resistance for designing state-of-the-art bipolar transistors and MOSFETs in this architecture; and a system architecture that is cheap and easy to integrate within various semiconductors manufacturing flows.

FIG. 1 shows a cross-section view of a transistor chip-scale package device 100 comprising a semiconductor active area and a metallization stack on top of the active area. In this example, the transistor 100 is a bipolar junction transistor. The semiconductor active area comprises a semiconductor substrate 102, which in this example is highly doped with n-type dopant. An epitaxial layer 104 is disposed on top of the semiconductor substrate 102. The epitaxial layer 104 may comprise un-doped or lightly n-doped semiconductor material. A base diffusion 110 is provided on top of the epitaxial layer 104. The base diffusion 110 may also be referred to as a base region. The base diffusion 110 comprises a region in which is doped with a concentration of p-type dopants. It will be appreciated by those skilled in the art that such regions may be formed by diffusion techniques or by any other suitable method for forming doped regions within a semiconductor structure (generally, in the following disclosure any part said to be a type of 'diffusion' may also be referred to as a corresponding 'region' which may be formed by any suitable method of introducing either p-type or n-type dopants, as appropriate, into a semiconductor structure).

In the device 100, an emitter diffusion 112 is provided on top of the base diffusion 110. The emitter diffusion 112 is doped with n-type dopant. Together, the base diffusion 110 and the emitter diffusion 112 form an example of a switching region of the device 100. As shown in FIG. 1, the switching region is spaced apart from the substrate by the epitaxial layer 104 such that no part of the switching region is in direct contact with the substrate.

The device 100 comprises a collector terminal 130 disposed on the epitaxial layer 104, a base terminal 132 electrically coupled to the base diffusion 110, and an emitter terminal 134 electrically coupled to the emitter diffusion 112. The collector terminal 130 is an example of a contact terminal. To function as a bipolar junction transistor, the collector terminal 130 is electrically coupled to the semiconductor substrate 102 via a collector coupling region 136. The collector coupling region 136 extends from the collector terminal 130 to the highly doped semiconductor substrate 102 and thereby provides an electrically conducting pathway between the collector terminal 130 and the substrate 102.

The semiconductor components shown in FIG. 1 (the substrate 102, the epitaxial layer 104, the base diffusion 110, the emitter diffusion 112 and the collector coupling region 136) comprise a semiconductor structure 108. Similarly, in the following disclosure, the semiconductor parts or components or regions of disclosed devices provide examples of semiconductor structures.

The collector terminal 130, the base terminal 132 and the emitter terminal 134 are electrically insulated from the semiconductor structure 108 by an oxide layer 106 disposed on top of the semiconductor structure 108, other than at the locations where they are coupled to the collector coupling region 136, base diffusion 110 and emitter diffusion 112 respectively.

In contrast to some vertical devices, the collector terminal 130 is advantageously located on the front side of the device 100 in order to provide for chip-scale-package applications. Without a dedicated collector front side active area, the collector terminal resistance may be too high for state-of-the-art bipolar transistor applications.

For transistors with high breakdown voltages, a lowly ohmic diffusion region, such as the collector coupling region 136, can be very difficult to realize, as the epitaxial layer 104 may have a large thickness, for example 20 μm or more. The collector coupling region 136 is in direct physical contact with the collector terminal 130 and is also in direct physical contact with the substrate 102. The collector coupling region 136 extends continuously between the collector terminal 130 and the substrate and thereby provides a bridge between the collector terminal 130 and the substrate 102. This bridge provides a relatively low resistance pathway for electrical current to flow between the substrate 102 and collector contact 130 compared to pathways that incorporate a part or parts of the epitaxial layer 104.

Figure 2:
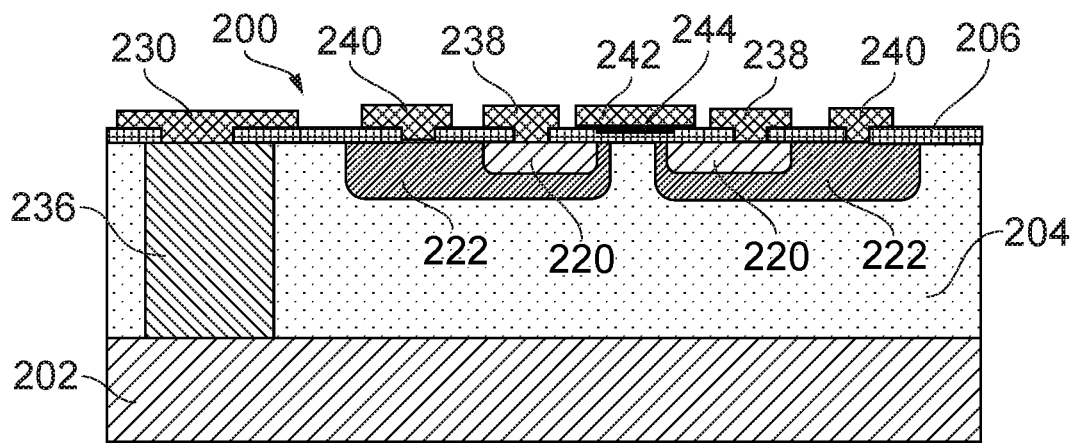
FIG. 2 shows a cross-section view of a planar Metal Oxide Semiconductor Field Effect Transistor (MOSFET)

FIG. 2 shows a cross-section view of a MOSFET 200. Features of the MOSFET 200 that are similar to the device of FIG. 1 have been given similar reference numerals and may not necessarily be discussed further here. The MOSFET 200 is an example of a planar MOSFET.

The MOSFET 200 comprises a source terminal 238 that is electrically coupled to an n-type source diffusion 220, a body terminal 240 that is electrically coupled to a p-type body diffusion 222, and a drain terminal 230 that is electrically coupled to an n-type doped substrate 202. The substrate 202 comprises the drain region of the MOSFET 200. The substrate 202 is electrically coupled to the drain terminal 230 by a drain coupling region 236. The structure and function of the drain coupling region 236 is similar to that of the collector coupling region of FIG. 1. The drain terminal 230 is an example of a contact terminal. It will be appreciated that the body diffusion 222 is a single connected region, connected outside the plane of the cross-section shown in FIG. 2. Similarly, the source diffusion 220, source terminal 238 and body terminal 240 are each single connected units, connected outside of the plane of the cross-section shown. Thereby, the body diffusion 222, the source diffusion 220 and other components that are connected outside of the plane of the cross-section shown may comprise a 'horseshoe' structure that connects either in front of, or behind, the cross-sectional plane shown in FIG. 2. Alternatively, these component may form a loop structure that connects both in front of and behind the cross-sectional plane shown in FIG. 2.

A gate terminal 242 is provided above the source diffusion 220 and is coupled to a polycrystalline layer 244 which comprises a gate of the MOSFET 200. Application of a voltage to the gate enables a conduction channel to open between the source diffusion 220 and the substrate 202 (which is the drain region) via the body diffusion 222. Current can then flow from the substrate 202 to the drain terminal 230 via the drain coupling region 236. The body diffusion 222 is configured to provide an isolation layer between the source diffusion 220 and the substrate 202. Together, the source diffusion 220 and the body diffusion 222 form an example of a switching region of the MOSFET 200.

It will be appreciated that the bipolar junction transistor of FIG. 1 and the MOSFET of FIG. 2 may be provided as either an n-p-n devices (as shown) or as a p-n-p devices (not shown). That is, any regions described as n-doped may instead be p-doped, and vice versa.

Figure 3:
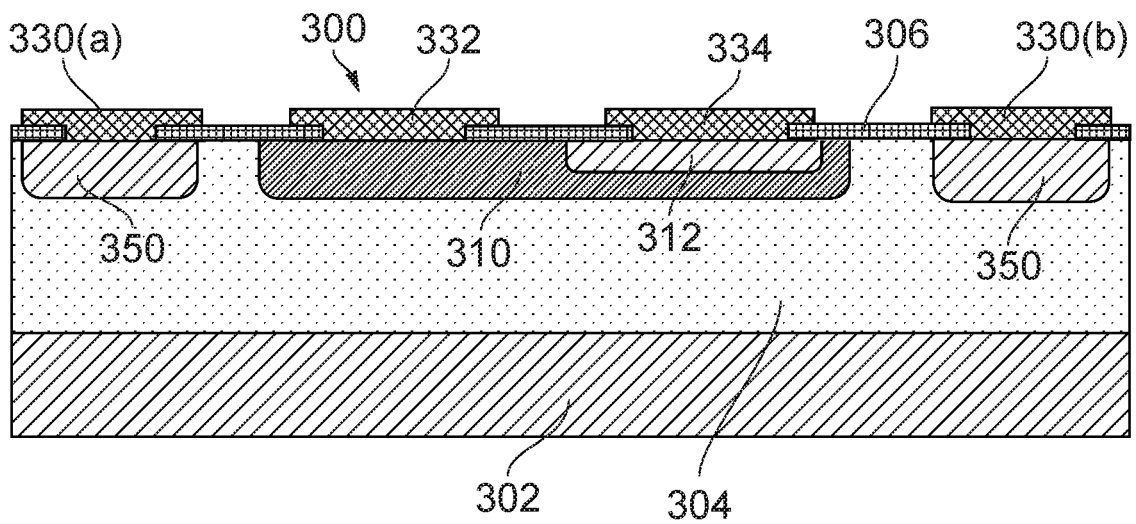
FIG. 3 shows a cross-section view of an example embodiment of a bipolar junction transistor.

FIG. 3 shows a cross-section view of a bipolar junction transistor device 300. Features of the device 300 that are similar to the device of FIG. 1 have been given similar reference numerals and may not be discussed further here.

The device 300 comprises a collector terminal 330. Since the device 300 is shown in cross section, a first part 330a of the collector terminal 330 is shown on the left hand side while a second part 330b of the collector terminal 330 is shown on the right hand side. The collector terminal 330 is, however, a single continuously connected unit because the first part 330a is connected to the second part 330b outside the plane of the cross-section shown. The collector terminal 330 is electrically coupled to a collector diffusion 350 which is formed on top of the epitaxial layer 304. In this example the collector diffusion 350 is more heavily n-doped that the epitaxial layer 304, which comprises a lightly n-doped material. Like the collector terminal 330, the collector diffusion 350 also comprises a single continuously connected region of the device 300. The collector diffusion 350 extends into the epitaxial layer 304 but does not extend through the full thickness of the epitaxial layer 304 to the substrate 302. Thereby, the epitaxial layer 304 forms a barrier between the collector diffusion 350 and the substrate 302. In this way, the collector diffusion 350 is not in direct contact with the substrate 304.

The device 300 comprises a base diffusion 310 on top of the epitaxial layer 304. An emitter diffusion 312 is provided on top of the base diffusion 310. The base diffusion 310 and the emitter diffusion 312 together comprise a switching region of the device 300. The switching region covers a switching area of the epitaxial layer 304. The collector diffusion 350 is provided outside of the switching area in an adjacent collector contact area of the device 300. This collector contact area can be produced either by implant and diffusion or non-stational diffusion from a depletion layer on top of the epitaxial layer 304, which is a method for semiconductor process technology. In order to compensate for the increased contact resistance through the epitaxial layer (compared to the resistance through regions such as the collector coupling region of FIG. 1 or the drain coupling region of FIG. 2), the size and shape of the front contact active area can be provided in such as way as to satisfy the requirements of state-of-the-art semiconductor devices, and is spaced apart from the substrate 302.

The functionality of the collector diffusion 350 requires that its doping level is high enough to be suitable for use with low-ohmic top metal contacts used in chip-scale package applications. Furthermore, fabrication of the collector diffusion 350 can advantageously be integrated into another process step for providing the semiconductor device 300, such as fabrication of the emitter diffusion 312. The size and shape of the collector diffusion 350 can be varied and increased in such a way that the increased contact resistance (compared to that of the device shown in FIG. 1) can be compensated for in order to satisfy the requirements of state-of-the-art vertical transistor devices such as BJTs.

Having the collector terminal 330 on the front side of the semiconductor device 300 (that is, the same side of the semiconductor device 300 as the base terminal 332 and the emitter terminal 334) is advantageous as it enables connection of the terminals to the outside world by more accessible and more compact means. Specifically, it is not necessary to, for example, solder contacts onto both of the back side and the front side of the semiconductor device 300. Further, by situating all of the contacts on the front side of the device 300, it is possible to integrate the semiconductor processing steps by which the device 300 is fabricated; it is not necessary to perform a series of steps for the front side of the device 300 and then perform an additional step or steps on the back side of the device. In addition, it is not necessary to form coupling regions (such as the collector coupling region of FIG. 1 or the drain coupling region of FIG. 2) that extend though the full thickness of the epitaxial layer 304. As discussed above, forming such coupling regions may be difficult because of the physical thickness of the epitaxial layer 304. Indeed, in some examples it may not even be practically possible, such as where the epitaxial layer is doped with p-type dopant, because forming a sufficiently deep p-type diffusion in a thick p-type epitaxial layer may be almost impossible.

The barrier between the contact diffusion 350 and the substrate 302, provided by the epitaxial layer 304, may be at least 2 µm thick or at least 3 µm thick. That is, at the closest approach between any part of the contact diffusion 350 and any part of the substrate 302, a shortest pathway between the contact diffusion 350 and the substrate 302 may traverse a portion of the epitaxial layer 304 that is at least 2 µm thick or at least 3 µm thick.

The barrier between the contact diffusion 350 and the substrate 304, provided by the epitaxial layer 304, may be at least 20% of a full thickness of the epitaxial layer. That is, when the epitaxial layer 304 is formed on top of the substrate 302 it may be said to have a full thickness. When the contact diffusion 350 is formed, so as to extend into the epitaxial layer 304, it may extend up to 80% of the full thickness of the epitaxial layer. Thereby, at the closest approach between any part of the contact diffusion 350 and any part of the substrate 302, a shortest pathway between the contact diffusion 350 and the substrate 302 may traverse a portion of the epitaxial layer 304 that is at least 20% of the thickness of the full thickness of the epitaxial layer 304.

Figure 4:
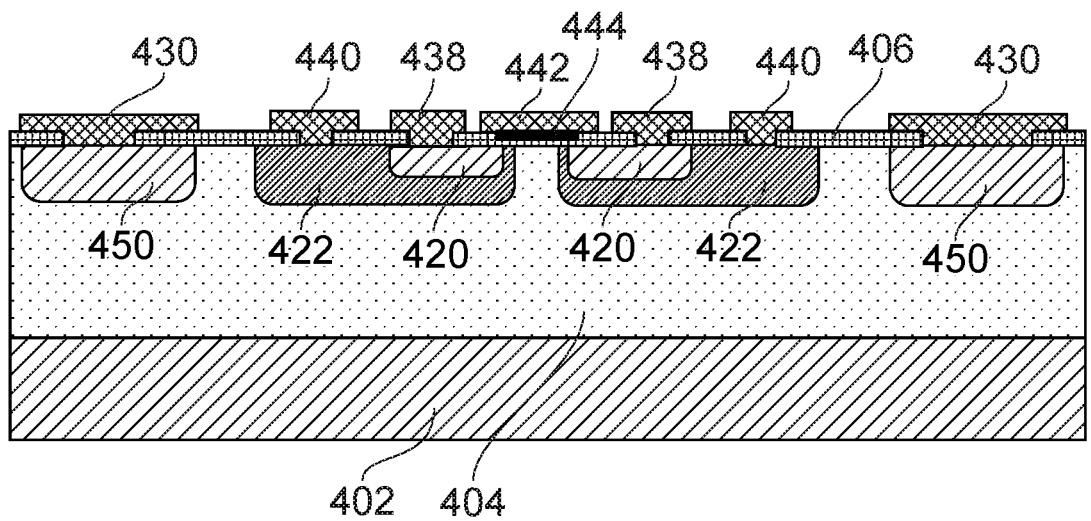
FIG. 4 shows a cross-section view of an example embodiment of a planar MOSFET.

FIG. 4 shows a cross section view of a MOSFET device 400. Features of the device 400 that are similar to features of FIGS. 2 and 3 have been given similar reference numerals and will not necessarily be further discussed here.

Figure 9A:
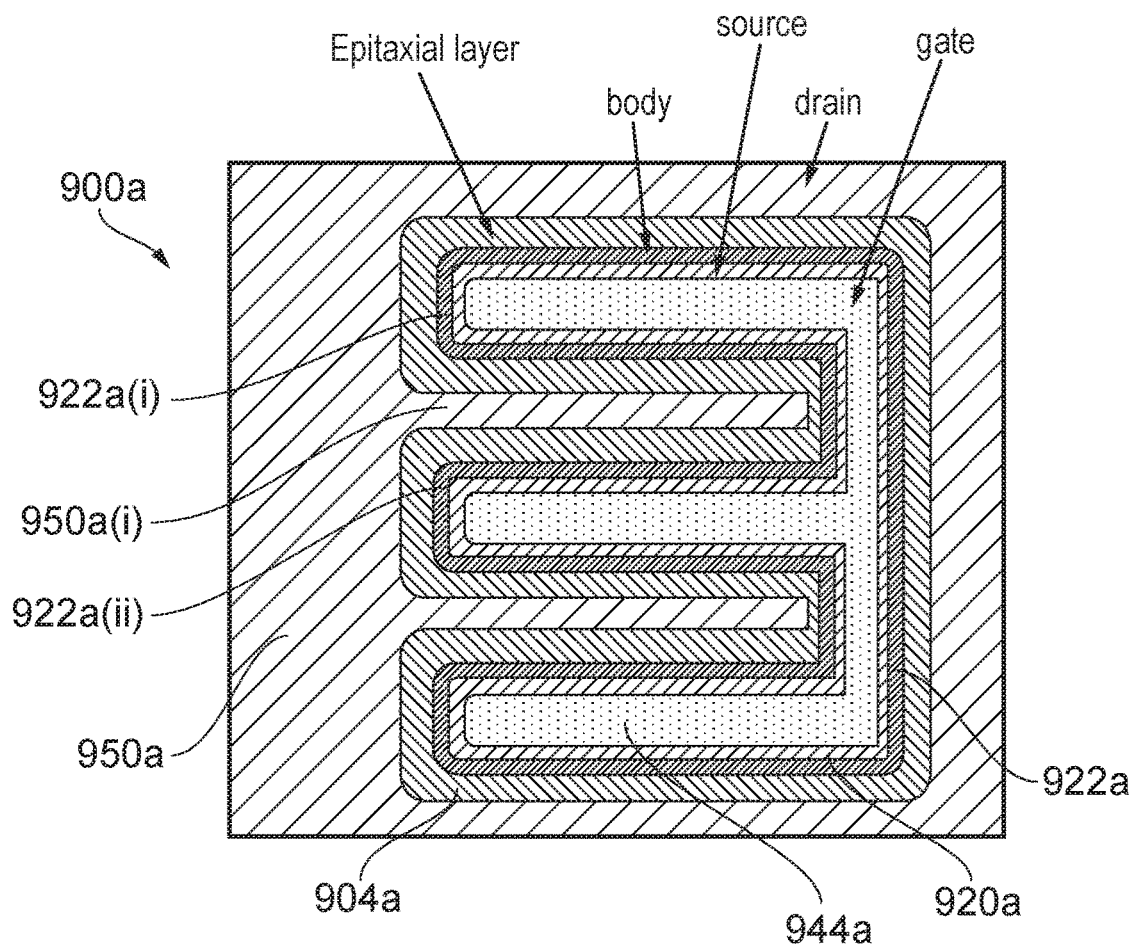
FIG. 9a shows a plan view of an example embodiment of a vertical trench MOSFET with interdigitated source and drain regions and a single gate structure.

Like the device shown in FIG. 3, the MOSFET device 400 has a single contact terminal that comprises a drain terminal 430 that is electrically coupled to a single drain diffusion 450, which is another example of a contact diffusion. The drain diffusion 450 is formed on top of the epitaxial layer such that the epitaxial layer is interposed between the drain diffusion 450 and the substrate 402. Thereby, the epitaxial layer 404 provides a barrier between the drain diffusion 450 and the substrate 402. As in the example of FIG. 3, the size and shape of the drain diffusion 450 can be configured to provide for improved performance of the MOSFET device 400 by enabling an advantageous level of electrical conduction between the substrate 402 (which is the drain of the MOSFET 200) and the drain terminal 430. This advantageous level of electrical conduction is provided for by providing a larger volume of drain diffusion 450 extending from the surface of the device 400 into the epitaxial layer 404 than the volume of a corresponding coupling region, such as the drain coupling region of FIG. 2. An example plan view of the drain diffusion is shown in FIG. 9a, and will be discussed below. FIG. 9a shows the increased size of the footprint of the drain diffusion. The greater volume occupied by the drain diffusion 450 than such a coupling region compensates for the lack of a direct physical connection between the drain diffusion 450 and the substrate 402 that is provided for by the drain coupling region shown in FIG. 2. As in the example of FIG. 2, the drain diffusion 450 is a single diffusion region that is connected outside of the plane of the cross-section, hence the appearance in FIG. 4 of two separate parts of the cross-section of the drain diffusion 450.

Figure 5:
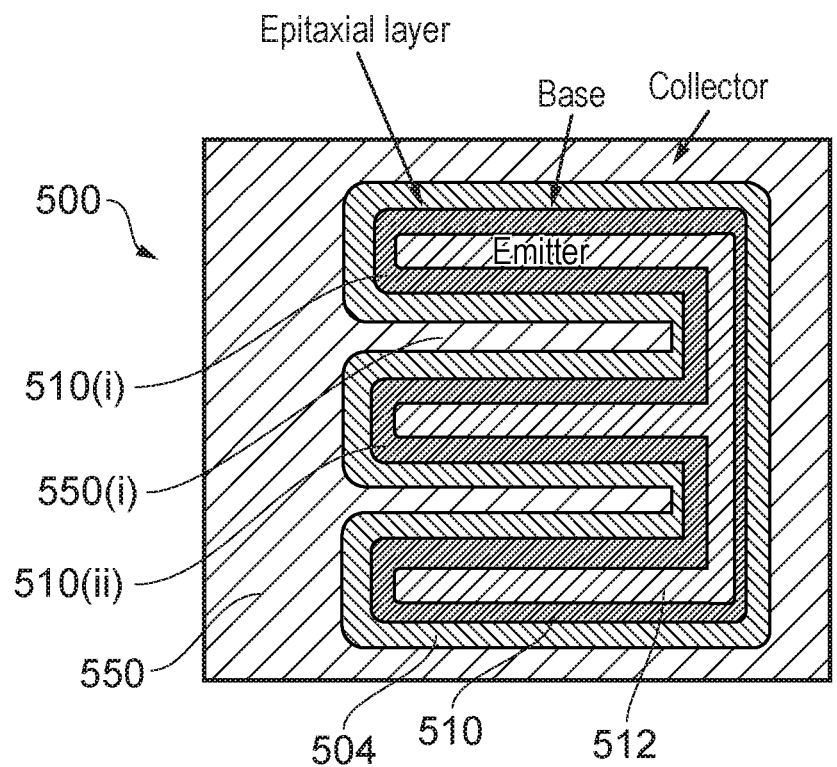
FIG. 5 shows a plan view of an example embodiment of a bipolar junction transistor with interdigitated collector and base diffusions.

FIG. 5 shows a plan view of a bipolar junction transistor device 500. The device 500 comprises an epitaxial layer 504 disposed on a substrate (not shown). A base diffusion 510 is provided on top of the epitaxial layer 504 and an emitter diffusion 512 is provided on top of the base diffusion 510. The base diffusion 510 and the emitter diffusion 512 together comprise a switching region that covers a switching area of the epitaxial layer 504. Spaced apart (with respect to the plane of the plan view shown in FIG. 5) from the switching area, a contact diffusion 550 is provided on top of a contact diffusion area (not shown) of the epitaxial layer 504. In this example, the contact diffusion 550 is thereby configured to extend around the switching region of the device 500. The contact diffusion 550 does not overlap the switching region. In this example, a portion of the epitaxial layer 504 is interposed between the contact diffusion 550 and the switching region of the device 500, this is the region of the epitaxial layer 504 that is visible in FIG. 5. Thereby, the epitaxial layer 504 provides a barrier between the contact diffusion 550 and the switching region of the device 500. The metallisation stack required for the device 500 is not shown in FIG. 5 in order to improve the clarity of the disclosure.

The contact diffusion area, that is, the area of the epitaxial layer 504 on top of which the contact diffusion is provided, is designed in such a way that the spreading resistance through the epitaxial layer is reduced. In the device 500 of FIG. 5 this reduction in resistance is achieved by using a finger structure for the contact diffusion area on the transistor surface, in order to increase the surface/contact area between the contact diffusion 550 and the epitaxial layer 504. The finger structure of the contact diffusion 550 comprises a plurality of limbs. The base diffusion 510 comprises a plurality of limbs. Some of the limbs of the contact diffusion 550 are interdigitated with some of the limbs of the base diffusion 510. The emitter diffusion 512 also comprises a plurality of limbs, with each limb of the emitter diffusion 512 enclosed within a limb of the base diffusion 512. Each limb of the emitter diffusion 512 is disposed on a limb of the base diffusion 510. For example, a first limb 550(i) of the contact diffusion 550 is interdigitated between a first limb 510(i) and a second limb 510(ii) of the base diffusion 510.

FIG. 6a shows a plan view of a bipolar junction transistor device 600a, which depicts the surface of the semiconductor structure of the device 600a. The metallisation stack is not shown in FIG. 6a to improve the clarity of the disclosure. Features of FIG. 6a that are similar to FIG. 5 have been given similar reference numerals and may not necessarily be further discussed here.

The device 600a comprises a base diffusion 610a and an emitter diffusion 612a. At the surface of the semiconductor structure, the device 600a shown in FIG. 6a comprises: (i) an outer portion 614a of the base diffusion 610a spaced apart from an inner portion 616a of the base diffusion 610a; (ii) the emitter diffusion 612a comprises a loop portion that is surrounded by the outer portion 614a of the base diffusion 610 awhile the loop portion of emitter diffusion 612a surrounds the inner portion 616a of the base diffusion 610a. The outer portion 614a of the base diffusion 610a is connected to a foundation portion (not shown) of the base diffusion 610a which is underneath the emitter diffusion 612a.

Similarly, the inner portion 616a of the base diffusion 610a is connected to the foundation portion of the base diffusion 610a underneath the emitter diffusion 612a. The inner portion 616a of the base diffusion 610a is thereby connected to the outer portion 614a of the base diffusion 610a. The base diffusion 610a supports the emitter diffusion 612a and provides a barrier between the emitter diffusion 612a and the epitaxial layer 604a; the emitter diffusion 612a is thereby spaced apart from the epitaxial layer 604a. By providing the emitter diffusion 612a in a loop configuration the area of the interface between the emitter diffusion 612a and the base diffusion 610a is increased. The increase in the area of the interface compensates for the higher collector contact resistance by providing a lower emitter resistance.

FIG. 6b shows a plan view of a bipolar junction transistor device 600b. The metallisation stack is not shown in FIG. 6b to improve the clarity of the disclosure. Features of FIG. 6b that are similar to FIG. 6a have been given similar reference numerals and may not necessarily be further discussed here.

The device 600bcomprises an emitter diffusion 612b with a plurality of loop portions that define holes through the thickness of the emitter diffusion 612b. The combination of loop portions and resulting holes may be considered an example of a mesh portion. The base diffusion 610b thereby comprises a plurality of inner portions that are separated from one another at the surface of the semiconductor structure and joined together underneath the emitter diffusion 612b by a common foundation portion (not shown). In this way, the inner portions extend away from the foundation portion like pegs on a peg board. It will be appreciated that, while the device 600b of FIG. 6b comprises a particular number of inner portions of the base diffusion 612b, any number of inner portions may be provided in the base diffusion of devices fabricated in accordance with the present disclosure. The base diffusion 610b is a single continuously connected structure with each of the plurality of inner portions of the base diffusion 610b connected to the outer portion 614b of the base diffusion 610b underneath the emitter diffusion 612b by virtue of being connected to the foundation portion. By selecting the number, size and shape of the inner portions, the properties of a device may be adapted to enable compensation of the higher collector contact resistance that devices may possess when fabricated according to the present disclosure.

FIG. 7 shows a plan view of a bipolar junction transistor device 700. Features of the device 700 that are similar to the device of FIG. 5 have been given similar reference numerals and may not necessarily be discussed further here.

The device 700 of FIG. 7 comprises a base diffusion 710 formed on top of an epitaxial layer 704. The device 700 comprises a contact diffusion 750. The base diffusion 710 is surrounded by the epitaxial layer 704 such that the base diffusion 710 does not directly connect to the contact diffusion 750. The contact diffusion 750 is designed in such a way that the contact diffusion 750 surrounds the base diffusion completely. It will be appreciated that in other examples the contact diffusion may partially surround or extend around the base diffusion 710. This design of contact diffusion 750 enables the spreading resistance through the contact diffusion 750 to be reduced by reducing the distance between the emitter diffusion 712 and the contact diffusion, and by increasing the area of the contact diffusion 750 that surrounds the active area of emitter diffusion 712 and the base diffusion 710.

Figure 8A:
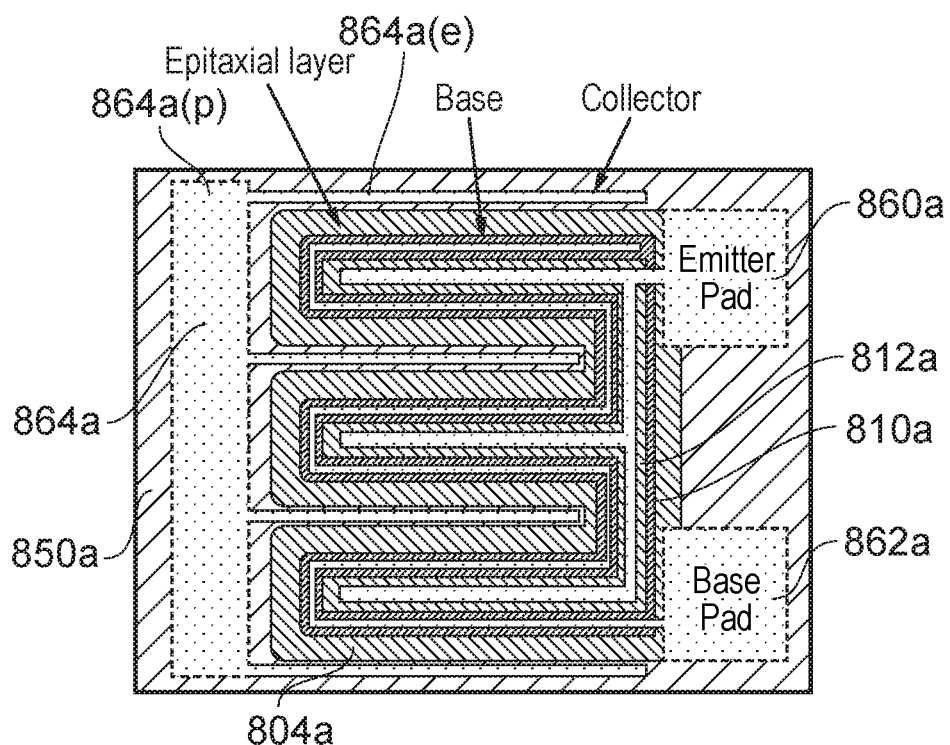
FIG. 8a shows a plan view of an example embodiment of a bipolar junction transistor similar to that of FIG. 5 with a metallisation stack shown on top of the transistor.

FIG. 8a shows a bipolar junction transistor device 800a, which corresponds to the device of FIG. 5, with portions of a metallisation stack illustrated. Features of the device 800a that are similar to the device shown in FIG. 5 have been given similar reference numerals and may not necessarily be discussed further here.

The device 800a comprises an emitter terminal 860a, a base terminal 862a and a contact terminal 864a. The emitter terminal 860a is electrically coupled to the emitter diffusion 812a. The emitter diffusion 812a comprises a plurality of limb portions and the emitter terminal 860a extends across a surface of one or more (and in this example, all) of the plurality of limb portions of the emitter diffusion 812a. By extending across the surface of the plurality of limb portions of the emitter diffusion 812a, the emitter terminal 860a may advantageously make electrical contact with an increased area of the emitter diffusion 812a and thereby reduce the electrical resistance of the electrical contact.

The base terminal 862a is electrically coupled to the base diffusion 810a. The base terminal 862a extends across a surface of the base diffusion 810a; in this example the base diffusion 810a comprises a plurality of limbs, and the base terminal 862a in this example also comprises a corresponding plurality of limbs. It will be appreciated that in other examples a base terminal may extend across a surface of at least part or one or more of any limbs of a base diffusion. By providing a large contact surface area between the base terminal 862a and the base diffusion 810a the contact resistance of the electrical connection of the device 800a of FIG. 8a may be reduced.

The contact terminal 864a is electrically connected to the contact diffusion 850a. The contact diffusion 850a comprises a plurality of limbs that are interdigitated with a plurality of limbs of the base diffusion 810a in a manner similar to that of the device of FIG. 5. The contact terminal 864a comprises a pad portion 864a(p), which may provide a solderable contact suitable for connection with the outside world, and one or more extending portions 864a(e). The extending portions 864a(e) extend across a surface of the limbs of the contact diffusion 850a and thereby are in electrical contact with the plurality of limbs of the contact diffusion 850a. By electrically connecting with a large area of the surface of the contact diffusion 850a the contact terminal 864a provides for a low electrical resistance of the electrical connection.

Figure 8B:
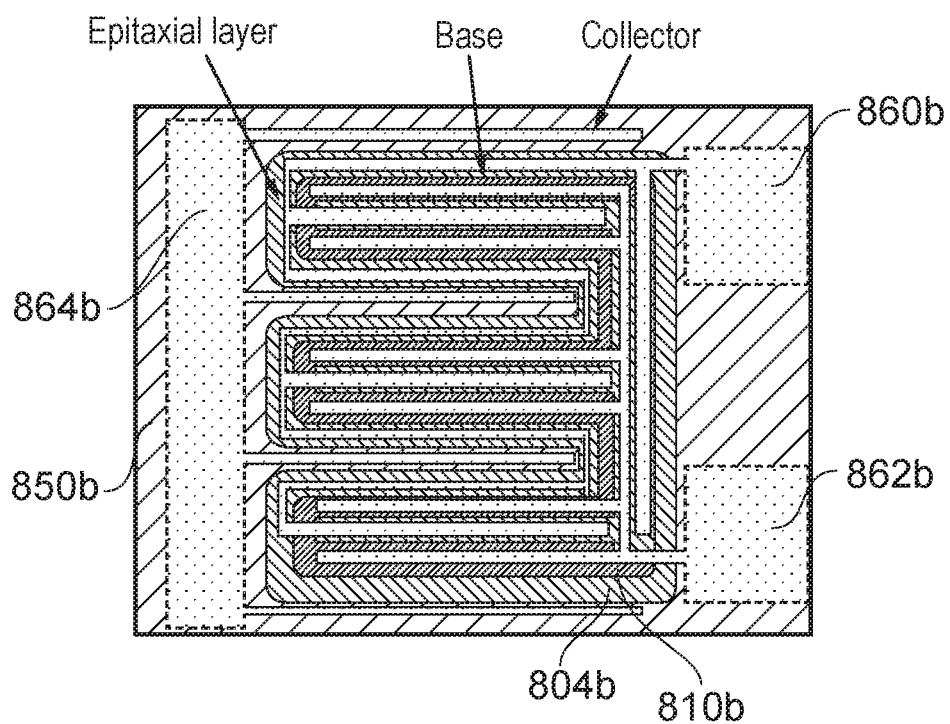
FIG. 8b shows a plan view of an example embodiment of a bipolar junction transistor similar to that of FIG. 8a with an alternative metallisation stack shown on top of the transistor.

FIG. 8b shows a bipolar junction transistor device 800b, which corresponds to the device of FIG. 5, with portions of a metallisation stack illustrated. Features of the device 800b that are similar to the device shown in FIG. 8a have been given similar reference numerals and may not necessarily be discussed further here.

The device 800b comprises an emitter terminal 860b and a base terminal 862b. The emitter terminal 860b extends across the emitter diffusion in a different geometry compared to the device of FIG. 8a. Similarly, the base terminal 862b extends across the base diffusion 810b in a different geometry compared to the device of FIG. 8a. It will be appreciated that different geometrical configurations of terminals can be used to optimize the contact resistances for different polarities of terminal, based on the specific application. Herein, the polarity of terminals refers to whether the terminal is a base, emitter or collector, for a bipolar junction transistor, or a source, drain or gate for a MOSFET. The polarity of a transistor refers to the structure of the transistor as either a p-n-p type device or an n-p-n type device.

The metal terminals for different polarities of transistors may be designed in meander-like structures in order to reduce the top-contact resistances and maximize the contact areas.

FIG. 9a shows a plan view of a vertical trench MOSFET device 900a. It will be appreciated that features of vertical trench MOSFET device 900a can be used with other types of MOSFET.

The device 900a of FIG. 9a comprises an epitaxial layer 904a disposed on top of a substrate (not shown). A p-type body diffusion 922a is provided on top of the epitaxial layer 904a, but does not extend all the way down to the substrate (not shown). The epitaxial layer 904a thereby provides a barrier between the body diffusion 922a and the substrate. An n-type source diffusion 920a is provided on top of the body diffusion 922a, but does not extend all the way through the body diffusion 922a. The body diffusion 922a thereby provides a barrier between the source diffusion 920a and the epitaxial layer 904a.

Both the body diffusion 922a and the source diffusion 920a are provided in a loop configuration that surrounds a gate 944a. The gate 944a extends downwards through the loop of source diffusion 920a and the loop of body diffusion 922a towards the epitaxial layer 904a. It will be appreciated by those skilled in the art that an insulating layer (not shown, to improve the clarity of the disclosure), which may be an oxide layer, can be provided around the gate 944a to provide for electrical insulation between the gate 944a and each of the source diffusion 920a, body diffusion 922a and the epitaxial layer 904a. The source diffusion 920a, body diffusion 922a and gate 944a may be considered to form a switching region of the device 900a.

The switching region of the device 900 is surrounded by a contact diffusion 950a at the surface of the semiconductor structure. As in the device of FIG. 5, the device 900 of FIG. 9 comprises a switching region with a plurality of limbs that are interdigitated with a plurality of limbs of the contact diffusion 950a. Each limb of the switching region in FIG. 9a comprises a portion of the body diffusion 922a, a portion of the source diffusion 920a and a portion of the gate 944a.

In this example, a first limb 950a(i) of the contact diffusion 950a is interdigitated between a first limb 922a(i) of the body diffusion 922a and a second limb 922a(ii) of the body diffusion 922a. By choosing the configuration of the contact diffusion 950a and the switching region, their shape, size and degree of interdigitation, it is possible to advantageously tune the properties of the device 900a. It will be appreciated that a metallization stack is not shown in FIG. 9a in order to improve the clarity of the disclosure.

Figure 9B:
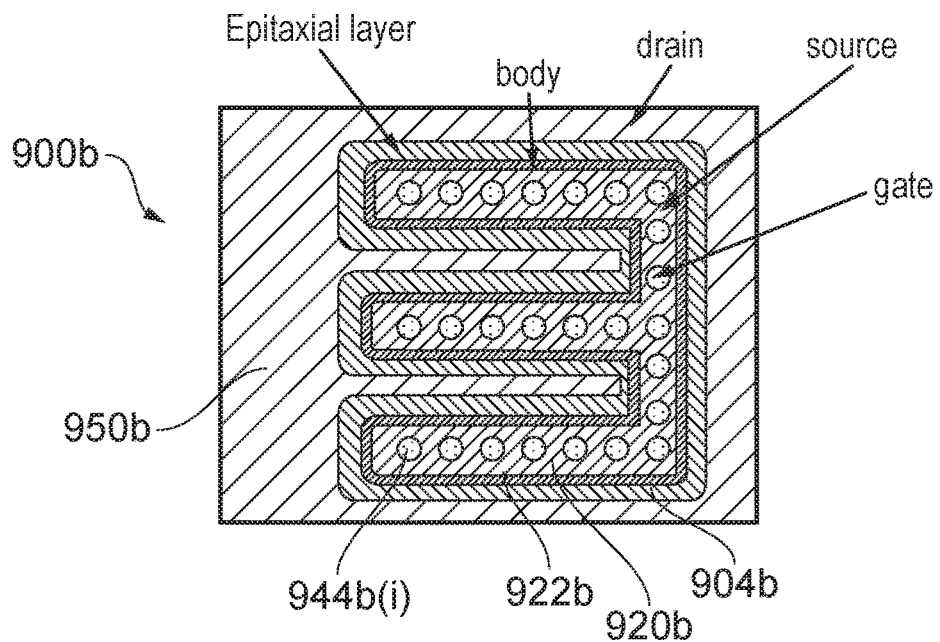
FIG. 9b shows a plan view of an example embodiment of a vertical trench MOSFET with interdigitated source and drain regions and a plurality of gate structures.

FIG. 9b shows a plan view of a MOSFET device 900b. The MOSFET device 900b provides an alternative example of a vertical trench MOSFET compared to FIG. 9a. Features of FIG. 9b that are similar to FIG. 9a have been given similar reference numerals and may not necessarily be discussed further here.

Device 900b has a gate 944b that comprises a plurality of vertical gate portions, such as the first vertical gate portion 944b(i), that extend downwards towards an epitaxial layer 904b though a body diffusion 922b and a source diffusion 920b. It will be appreciated that while the device 900b comprises a particular number of vertical gate portions, devices may be fabricated with any number of vertical gate portions. Thereby, the body diffusion 922b comprises a plurality of loops, one loop around each of the vertical gate portions and similarly the source diffusion 920b comprises a plurality of loops, one loop around each of the vertical gate portions. By configuring the number, size, shape, position and spatial distribution of the plurality of vertical gate portions it is possible, advantageously, to tune the properties of the device 900b.

Figure 10A:
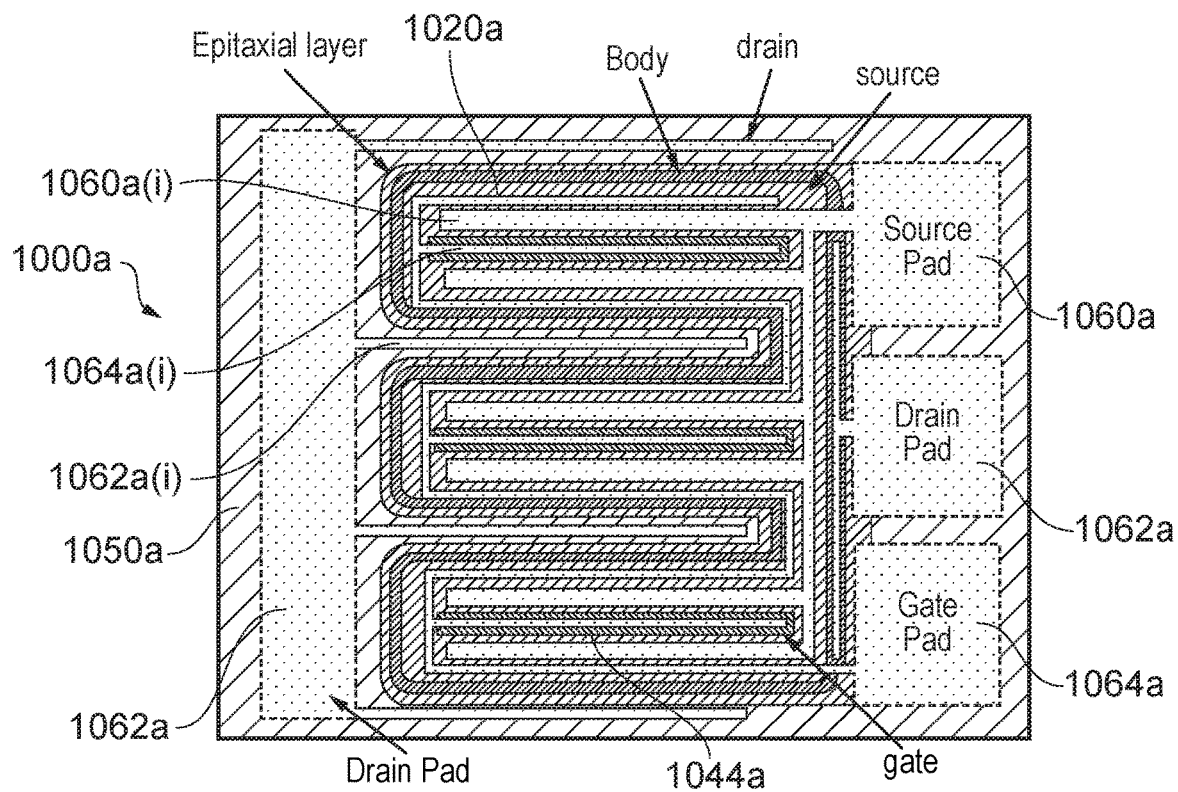
FIG. 10a shows a plan view of an example embodiment of a vertical trench MOSFET similar to that of FIG. 9a, with a metallisation stack shown on top of the transistor.

FIG. 10a shows a MOSFET device 1000a similar to that of FIG. 9a, but with additional details of the metallization stack depicted. Features of FIG. 10a that are similar to features of FIG. 9a have been given similar reference numerals and may not necessarily be discussed further here.

The device 1000a comprises a source terminal 1060a, a drain terminal 1062a, and a gate terminal 1064a. The terminals 1060a, 1062a, 1064a may be solderable using Sn-soldering techniques. The source terminal 1060a is electrically coupled to a source diffusion 1020a. The drain terminal 1062a is electrically coupled to a contact diffusion 1050a. The gate terminal 1064a is electrically coupled to a gate 1044a.

In this example, the source terminal 1060a comprises a plurality of limbs, which correspond to the limbs of the source diffusion 1020a, such as a first source terminal limb 1060a(i). In this example, the contact diffusion 1050a comprises a plurality of limbs, and the drain terminal 1062a also comprises a plurality of limbs, which correspond to the limbs of the contact diffusion 1050a, such as a first drain terminal limb 1062a(i). In this example, the gate 1044a also comprises a plurality of limbs, and the gate terminal 1064a comprises a corresponding plurality of limbs, such as the first gate terminal limb 1064a(i). It will be appreciated that while the device 1000a has a particular number of the aforementioned limbs, devices generally may be constructed according to the present disclosure with any number of such limbs. By making electrical contact with a plurality of limbs, the source terminal, drain terminal and gate terminal can provide for a lower contact resistance and thereby, improved functionality of the device 1000a.

Figure 10B:
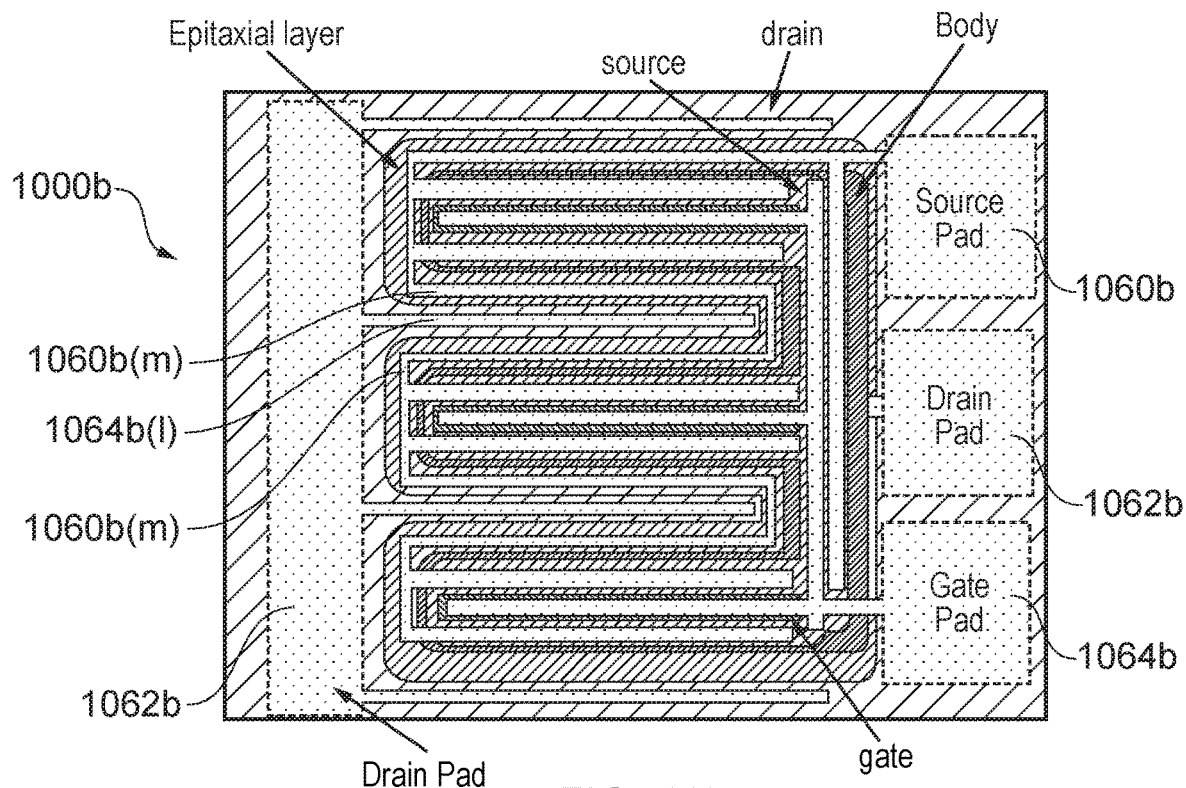
FIG. 10b shows a plan view of an example embodiment of a vertical trench MOSFET similar to that of FIG. 10a, with an alternative metallisation stack shown on top of the transistor.

FIG. 10b shows a MOSFET device 1000b similar to that of FIG. 10a, but with an alternative topology of metallization stack depicted. Features of FIG. 10a that are similar to features of FIG. 10b have been given similar reference numerals and may not necessarily be discussed further here.

The device 1000b comprises a source terminal 1060b, a drain terminal 1062b, and a gate terminal 1064b. The source terminal 1060b comprises a meander structure 1060b(m) that is interdigitated with a limb structure 1064b(I) of the gate terminal 1064b. It will be appreciated that many different possible geometries of source terminal, gate terminal and drain terminal may be appropriate for use as part of devices of the present disclosure and that by appropriately configuring the geometry of the terminals the performance of the resulting device and be advantageously tuned to suit a particular application.

Figure 11:
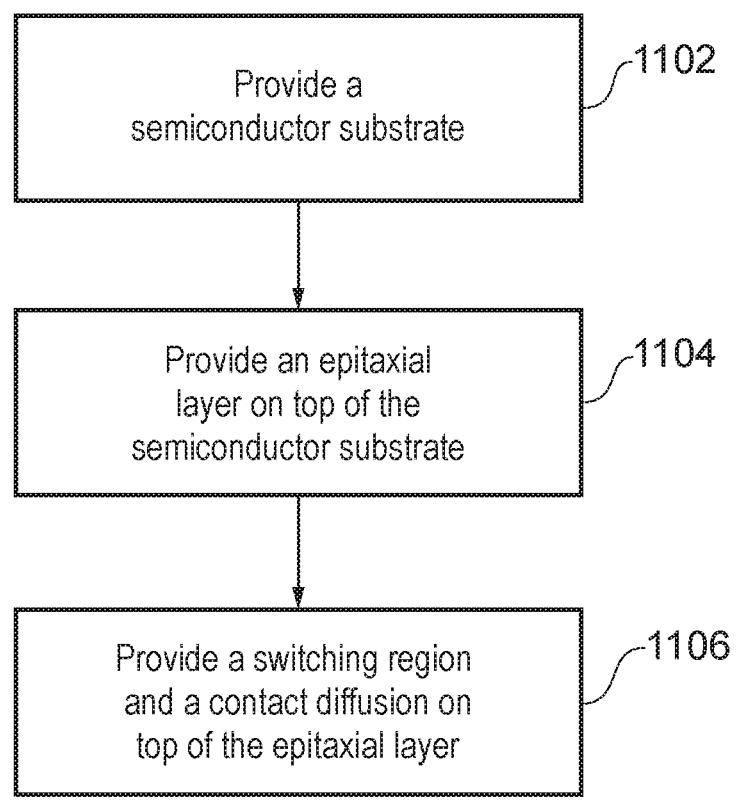
FIG. 11 shows a flow chart that depicts an example embodiment of a method for providing a semiconductor device.

FIG. 11 shows a flowchart 1100 that provides a method for fabricating devices according to the present disclosure. The method comprises a first step 1102 of providing a doped semiconductor substrate. The method comprises a second step 1104 of providing an epitaxial layer on top of the substrate, the epitaxial layer having a lower concentration of dopant than the substrate. The method comprises a third step 1104 of providing a switching region on top of the epitaxial layer; and disposing a contact diffusion on top of the epitaxial layer, the contact diffusion having a higher concentration of dopant than the epitaxial layer; wherein the epitaxial layer thereby forms a barrier between the contact diffusion and the substrate.

In the example of FIG. 11, the third step comprises providing the switching region and the contact diffusion as part of a single process step. It will be appreciated that in other examples, the third process step of FIG. 11 may be divided into a plurality of separate steps that may be performed in a sequence in any convenient order.

Embodiments of the present disclosure may provide a number of advantageous features. For example, the terminals of devices fabricated according to the present disclosure may be solderable by conventional Sn-based soldering methods. The integration of emitter/source and collector/drain active area processing may be achieved within one process step. Thereby, the same set of equipment and the same process stage can be applied to create the active areas for the emitter/source and the collector/drain of a semiconductor device. Sufficiently low collector/drain front contact resistance may be provided for state-of-the-art bipolar junction transistors and MOSFETs using the architecture of the present invention. A system architecture which is cheap and easy to integrate within various semiconductors manufacturing flows may be provided. This may be especially desirable for discrete bipolar junction transistor and MOSFET manufacturing process flows.

Embodiments of the present disclosure may provide advantageous replacement technology which is relatively cheap in terms of process integration, tooling and processing on the one hand, and on the other provides a technology that enables the possibility for creating synergies between various diffusion process steps. In particular it can be advantageous to use the same process steps for different active areas such as emitter and collector on the same equipment and to do so during the same process stage.

Chip-scale package (CSP) devices can have solderable front contacts, for all polarities, to enable connection to the outer world, which may include harsh environments. For conventional vertical transistor devices, the collector/drain contact has to be relocated to the front without loss of electrical performance.

By applying the collector/drain front contact without a dedicated through-hole contact process by using the electrical contact via the epitaxial layer and substrate and integrating the collector/drain front contact into the emitter/source process flow, the whole system architecture and process flow can be substantially reduced in complexity and costs. The increased contact resistance can be compensated either by applying a large collector/drain substrate and contact area, or by applying emitter/source diffusions with a loop configuration to use the active area most effectively. The presented architecture can be easily integrated into standard semiconductor process flows and represents a cheap solution in terms of cost-of-ownership for chip-scale package or bare die devices.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. A semiconductor device comprising:
   a doped semiconductor substrate;

an epitaxial layer, disposed on top of the substrate, the epitaxial layer having a lower concentration of dopant than the substrate;

a switching region disposed on a top surface of the epitaxial layer; and a contact diffusion disposed on the top surface of the epitaxial layer, the contact diffusion having a higher concentration of dopant than the epitaxial layer, wherein the contact diffusion extends around and surrounds the switching region in a plane parallel to a surface of the substrate;

wherein the epitaxial layer forms a barrier between the contact diffusion and the substrate, a barrier between the contact diffusion and the switching region, and a barrier between the switching region and the substrate, so that no coupling region extends through a full thickness of the epitaxial layer, and wherein the substrate, the epitaxial layer, and the contact diffusion have the same conductivity type.

2. The semiconductor device of claim 1, further comprising a contact terminal, wherein the contact diffusion extends from the contact terminal towards the substrate and is spaced apart from the substrate by the epitaxial layer.

3. The semiconductor device of claim 1, wherein the barrier between the contact diffusion and the substrate, provided by the epitaxial layer, is at least 2 µm thick or at least 3 µm thick.

4. The semiconductor device of claim 1, wherein the barrier between the contact diffusion and the substrate, provided by the epitaxial layer, is at least 20% of a full thickness of the epitaxial layer.

5. The semiconductor device of claim 1, wherein the switching region comprises a plurality of limbs and the contact diffusion comprises a plurality of limbs interdigitated between the plurality of limbs of the switching region.

6. The semiconductor device of claim 5, further comprising a metallic contact diffusion terminal disposed on top of the contact diffusion and interdigitated between the limbs of the switching region.

7. The semiconductor device of claim 1, wherein the switching region comprises:
a base diffusion in contact with the top surface of the epitaxial layer; and
an emitter diffusion disposed on top of the base diffusion, the base diffusion configured to form a barrier between the emitter diffusion and the epitaxial layer.

8. The semiconductor device of claim 7, wherein the emitter diffusion comprises at least one loop portion, disposed on top of the base diffusion, that extends around an inner portion of the base diffusion.

9. The semiconductor device of claim 5, wherein each limb of the switching region comprises an emitter diffusion limb disposed on top of a base diffusion limb.

10. The semiconductor device of claim 9, further comprising a metallic emitter contact is electrically connected to the emitter diffusion along at least a portion of a length of at least one limb of the emitter diffusion, and/or a metallic base contact is electrically connected to the base diffusion along at least a portion of a length of at least one limb of the base diffusion.

11. The semiconductor device of claim 1, wherein the switching region comprises:
a body diffusion formed on the top surface of the epitaxial layer;
a source diffusion formed on top of the body diffusion; and
a gate disposed on top of the switching region between the source diffusion and the body diffusion;
wherein the substrate comprises a drain for the semiconductor device.

12. A chip-scale package device comprising the semiconductor device of claim 1.

13. A method of providing a semiconductor device, the method comprising:
providing a doped semiconductor substrate;
disposing an epitaxial layer on a top surface of the doped semiconductor substrate, the epitaxial layer having a lower concentration of dopant than the doped semiconductor substrate;
disposing a switching region on a top surface of the epitaxial layer; and
disposing a contact diffusion on the top surface of the epitaxial layer, the contact diffusion having a higher concentration of dopant than the epitaxial layer, wherein the contact diffusion extends around and surrounds the switching region in a plane parallel to a surface of the substrate;
wherein the epitaxial layer forms a barrier between the contact diffusion and the doped semiconductor substrate, a barrier between the contact diffusion and the switching region, and a barrier between the switching region and the doped semiconductor substrate, so that no coupling region extends through a full thickness of the epitaxial layer, and
wherein the doped semiconductor substrate, the epitaxial layer, and the contact diffusion have the same conductivity type.

14. The method of claim 13, wherein the switching region and the contact diffusion are provided as part of a single process step.

* * * * *